United States Patent
Matsuki et al.

(10) Patent No.: US 9,063,371 B2
(45) Date of Patent: Jun. 23, 2015

(54) BACKLIGHT DEVICE, LIQUID CRYSTAL DISPLAY APPARATUS, AND LENS

(75) Inventors: Daizaburo Matsuki, Osaka (JP); Katsuhiko Hayashi, Nara (JP); Kenji Hasegawa, Osaka (JP); Hiroshi Yamaguchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 379 days.

(21) Appl. No.: 13/615,644

(22) Filed: Sep. 14, 2012

(65) Prior Publication Data

US 2013/0002983 A1    Jan. 3, 2013

Related U.S. Application Data

(63) Continuation of application No. PCT/JP2011/006748, filed on Dec. 1, 2011.

(30) Foreign Application Priority Data

Dec. 16, 2010 (JP) .................................. 2010-280136

(51) Int. Cl.
*G02F 1/1335* (2006.01)
*G02B 19/00* (2006.01)
*H01L 33/58* (2010.01)

(52) U.S. Cl.
CPC .... *G02F 1/133603* (2013.01); *G02F 1/133605* (2013.01); *H01L 33/58* (2013.01); *G02B 19/0066* (2013.01); *G02B 19/0071* (2013.01); *G02B 19/0028* (2013.01)

(58) Field of Classification Search
CPC ................................................. G02F 1/133606
USPC ....................................... 349/64; 362/311.02
See application file for complete search history.

(56) References Cited

U.S. PATENT DOCUMENTS

| | | | |
|---|---|---|---|
| 8,147,100 B2 * | 4/2012 | Yamaguchi | 362/311.02 |
| 2007/0109952 A1 | 5/2007 | Jeong et al. | |
| 2010/0188609 A1 * | 7/2010 | Matsuki et al. | 349/64 |

FOREIGN PATENT DOCUMENTS

| | | |
|---|---|---|
| CN | 102369390 A | 3/2012 |
| JP | H01-260706 A | 10/1989 |
| JP | 2006-092983 A | 4/2006 |
| JP | 2006-286608 A | 10/2006 |
| JP | 2009-043628 A | 2/2009 |

(Continued)

*Primary Examiner* — Thanh-Nhan P Nguyen
(74) *Attorney, Agent, or Firm* — James W. Judge

(57) ABSTRACT

Provided is a backlight device having: a light source element having LEDs and a lens expanding light from the LEDs; a housing containing the element; a diffuser plate covering an opening portion of the housing; and a reflection sheet reflecting light emitted from the element, toward the diffuser plate. The LEDs are arranged in one or more rows, at a central zone. The lens has an incident surface receiving light from the LEDs, and an exit surface from which the light goes out, being expanded. In the exit surface, in an optical-axis-containing sectional plane viewed laterally along the orientation in which the LEDs are arrayed, the lens's curvature C in a minute interval along the exit surface is maximum in a range $60°<\theta_i<80°$, where $\theta_i$ is the angle between the optical axis, and a line connecting the center of the minute interval and the position of a light source on the optical axis.

12 Claims, 14 Drawing Sheets

(56) References Cited

FOREIGN PATENT DOCUMENTS

| | | |
|---|---|---|
| TW | 201001026 A1 | 1/2010 |
| WO | WO-2009-157166 A1 | 12/2009 |
| WO | WO-2010-016199 A1 | 2/2010 |
| WO | WO-2010-131504 A1 | 11/2010 |
| WO | WO-2010-134565 A1 | 11/2010 |

* cited by examiner

F I G. 1
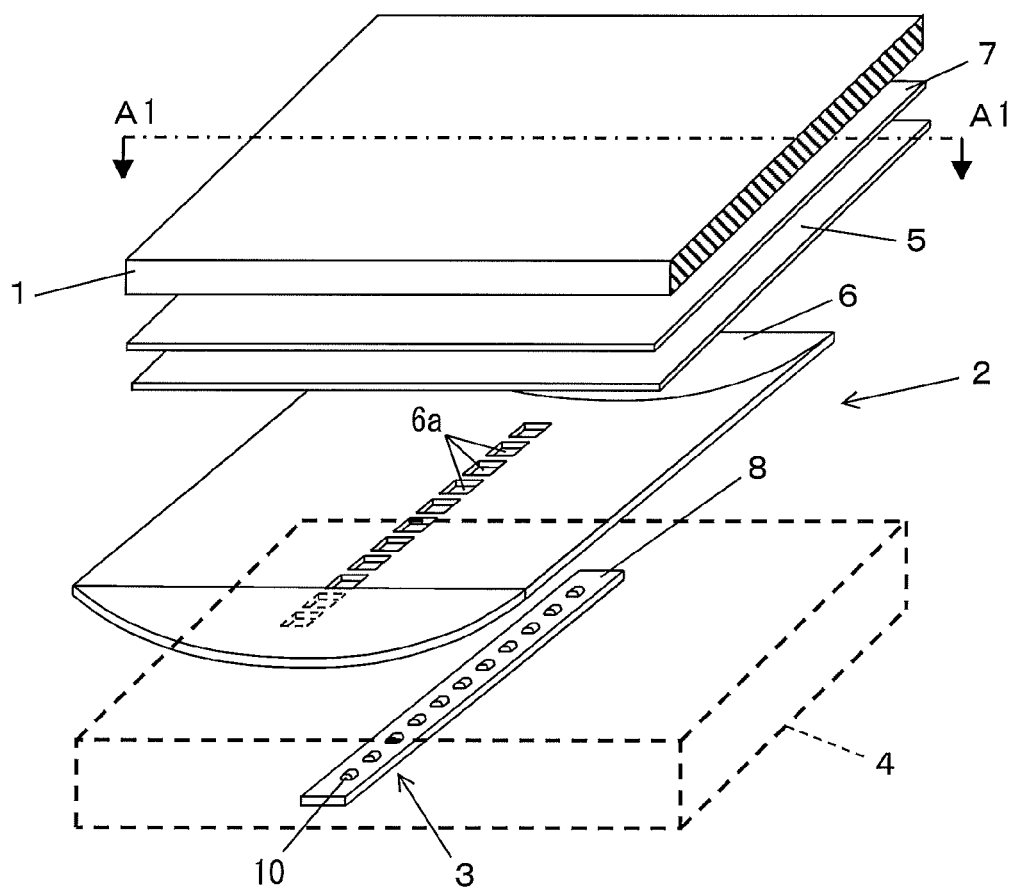

F I G. 5
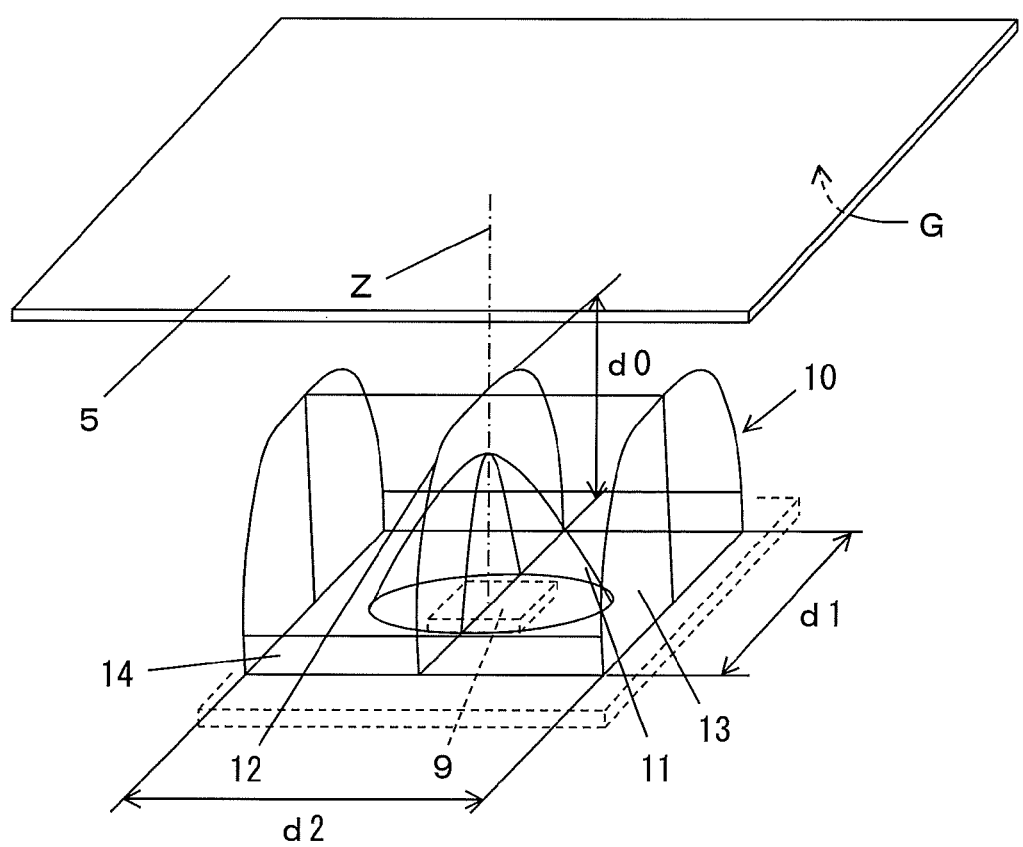

F I G. 1 1
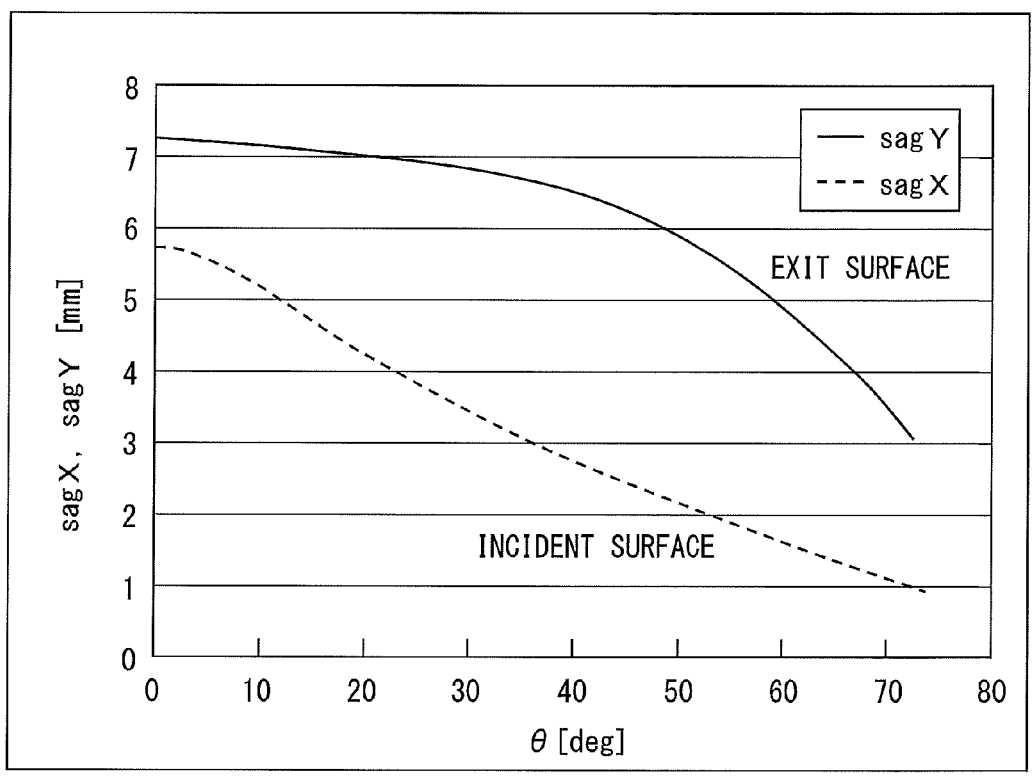

BACKLIGHT DEVICE, LIQUID CRYSTAL DISPLAY APPARATUS, AND LENS

BACKGROUND

1. Field

The present disclosure relates to a backlight device and a liquid crystal display apparatus, as well as to a lens, involving light emitting diodes used as a light source.

2. Description of the Related Art

Conventionally in a backlight device for a large-sized liquid crystal display apparatus, multiple cold cathodes are arranged just below a liquid crystal panel. The multiple cold cathodes are used together with members such as a diffuser plate and a reflector plate. In addition, in recent years, a light emitting diode has come to be used as a light source for backlight devices. The efficiency of a light emitting diode has recently increased, and therefore is expected to be a light source having decreased power consumption and replacing a fluorescent lamp. What is more, the brightness level of light emitting diodes used as a light source for a liquid crystal display apparatus can be controlled in accordance with video to lower the power consumption of the liquid crystal display apparatus.

In a backlight device using light emitting diodes as a light source for a liquid crystal display apparatus, multiple light emitting diodes are arranged as a substitute for cold cathodes. If multiple light emitting diodes are used, uniform brightness can be obtained on the surface of the backlight device, but the cost increases because a large number of light emitting diodes are needed. There is an approach for decreasing the number of light emitting diodes to be used by increasing the output of each individual light emitting diode. For example, Patent Literature 1 (Japanese Patent Publication No. 3875247) proposes a lens for obtaining a uniform planar light source with even a small number of light emitting diodes.

In addition, as disclosed in Patent Literature 2 (Japanese Laid-Open Patent Publication No. 2006-286608), a light source is known which includes: a plurality of point light sources one-dimensionally arranged; and elongate cylindrical lenses provided above the plurality of light sources.

SUMMARY

The present disclosure has been made in view of the above circumstances, to provide a backlight device, a liquid crystal display apparatus, and a lens, with a simple configuration and low cost, which secure sufficient brightness, using light-emitting diodes in the backlight device.

In one general aspect, the technology disclosed herein features a backlight device that includes: a light source element that includes a plurality of light emitting diodes and a lens that spreads out light from the light emitting diodes; a housing configured to contain the light source element; a diffuser plate provided so as to cover an opening in the housing; and a reflection sheet configured to reflect light emitted from the light source element, toward the diffuser plate, wherein the plurality of light emitting diodes of the light source element are arrayed in one row or in a plurality of rows, at a central zone, the lens has an incident surface which light from the light emitting diodes enters, and an exit surface from which the light goes out having been spread, and the exit surface of the lens is configured such that, in an optical-axis-containing sectional plane viewed laterally along the orientation in which the light emitting diodes are arrayed, the len's curvature C in a minute interval along the exit surface takes the maximum in a range defined by $60°<\theta_i<80°$, where $\theta_i$ is the angle between the optical axis, and a line connecting the center of the minute interval and the position of a light source on the optical axis.

In another general aspect, the technology disclosed herein features a liquid crystal display apparatus that includes: a liquid crystal display panel; and a backlight device placed on the back surface side of the liquid crystal display panel and having a size corresponding to the liquid crystal display panel, wherein the backlight device includes: a light source element that includes a plurality of light emitting diodes and a lens that spreads out light from the light emitting diodes; a housing configured to contain the light source element; a diffuser plate provided so as to cover an opening in the housing; and a reflection sheet configured to reflect light emitted from the light source element, toward the diffuser plate, the plurality of light emitting diodes of the light source element are arrayed in one row or in a plurality of rows, at a central zone, the lens has an incident surface which light from the light emitting diodes enters, and an exit surface from which the light goes out having been spread, and the exit surface of the lens is configured such that, in an optical-axis-containing sectional plane viewed laterally along the orientation in which the light emitting diodes are arrayed, the len's curvature C in a minute interval along the exit surface takes the maximum in a range defined by $60°<\theta_i<80°$, where $\theta_i$ is the angle between the optical axis, and a line connecting the center of the minute interval and the position of a light source on the optical axis.

In another general aspect, the technology disclosed herein features a lens that is used in a backlight device having a light source element that includes a plurality of light emitting diodes and a lens that spreads out light from the light emitting diodes, wherein the plurality of light emitting diodes of the light source element are arrayed in one row or in a plurality of rows, at a central zone of the backlight device, the lens has an incident surface which light from the light emitting diodes enters, and an exit surface from which the light goes out having been spread, and the exit surface is configured such that, in an optical-axis-containing sectional plane viewed laterally along the orientation in which the light emitting diodes are arrayed, the len's curvature C in a minute interval along the exit surface takes the maximum in a range defined by $60°<\theta_i<80°$, where $\theta_i$ is the angle between the optical axis, and a line connecting the center of the minute interval and the position of a light source on the optical axis.

According to the present disclosure, in a backlight device using light emitting diodes, a light source element has a plurality of lenses linearly arrayed so as to face the central zone of a liquid crystal display panel, whereby a backlight device and a liquid crystal display apparatus, with a simple configuration and low cost, securing sufficient brightness, can be provided.

BRIEF DESCRIPTION OF THE DRAWINGS

FIG. 1 is an exploded perspective view showing the schematic configuration of the entirety of a liquid crystal display apparatus using a backlight device according to an embodiment of the present disclosure;

FIG. 5 is a diagram illustrating the basic configuration of the light source element in the backlight device according to the embodiment of the present disclosure;

FIG. 11 shows the relationship among θ, sagX, and sagY in the lens shown in FIG. 9;

DETAILED DESCRIPTION

Hereinafter, a backlight device and a liquid crystal display apparatus using the backlight device, according to an embodiment of the present disclosure, will be described with reference to the drawings.

Figure 2:
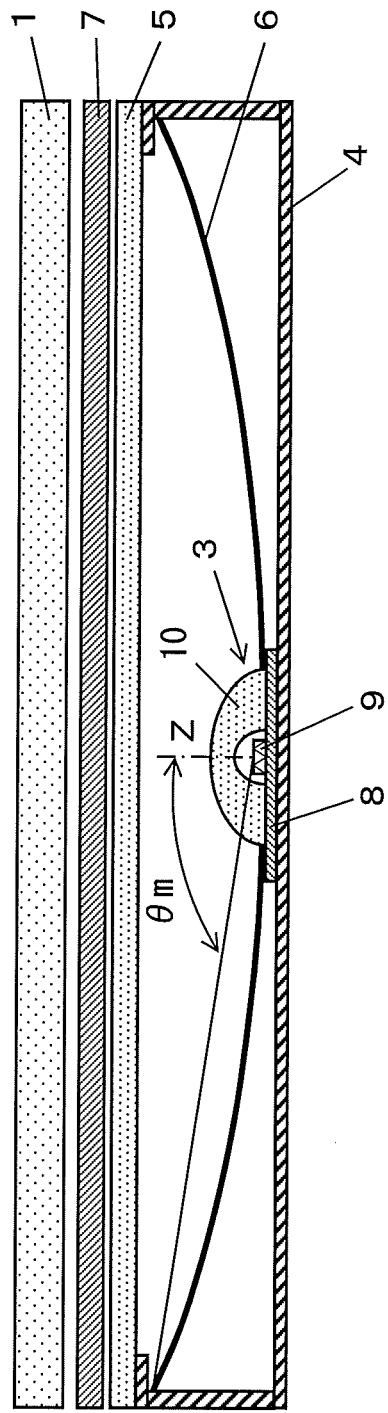
FIG. 2 is a sectional view taken along a line A1-A1 in FIG. 1.

FIG. 1 is an exploded perspective view showing the schematic configuration of the entirety of the liquid crystal display apparatus using the backlight device according to the embodiment of the present disclosure. FIG. 2 is a sectional view taken along a line A1-A1 in FIG. 1.

As shown in FIGS. 1 and 2, the liquid crystal display apparatus includes: a liquid crystal display panel 1 of transmission type, having a rectangular and planar shape; and a backlight device 2 having a cuboid shape and a size corresponding to the liquid crystal display panel 1, and placed on the back-surface side of the liquid crystal display panel 1.

The backlight device 2 includes: a light source element 3 placed so as to face the central zone of the liquid crystal display panel 1 and linearly extending along the long-side direction of the liquid crystal display panel 1; a housing 4 having a cuboid shape, which contains the light source element 3; a diffuser plate 5 placed between the liquid crystal display panel 1 and the light source element 3 so as to cover opening portions 6a of the housing 4; and a reflection sheet 6 which reflects light emitted from the light source element 3, toward the liquid crystal display panel 1, that is, the diffuser plate 5.

The diffuser plate 5 is provided with an optical sheet laminated unit 7 having a size corresponding to the liquid crystal display panel 1, the optical sheet laminated unit 7 being positioned between the liquid crystal display panel 1 and the front surface of the diffuser plate 5. The optical sheet laminated unit 7 includes, for example, a prism sheet for concentrating incoming light from the diffuser plate 5 toward the liquid crystal display panel 1 which is present in front; a diffuser sheet for further diffusing the incoming light from the diffuser plate 5; and a polarizing sheet which allows light having a specific polarization plane to pass so as to make the polarization plane of the incoming light correspond to the polarization plane of the liquid crystal display panel 1.

Figure 3:
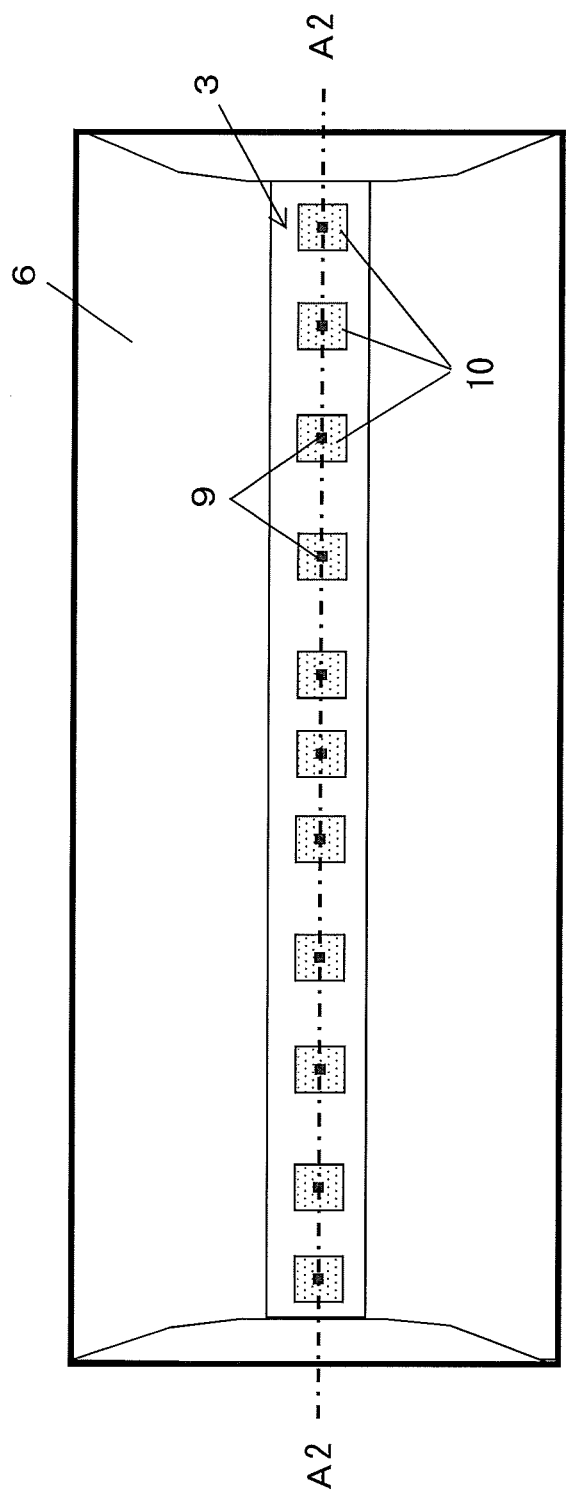
FIG. 3 is a plane view showing a light source element of the backlight device.
Figure 4:
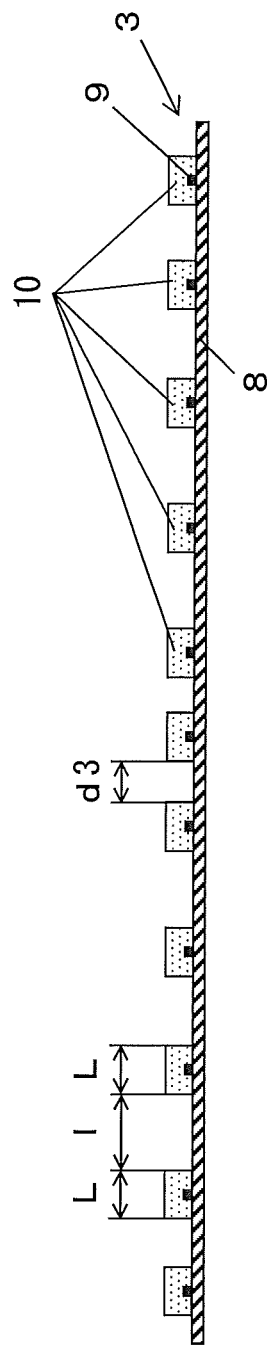
FIG. 4 is a sectional view taken along a line A2-A2 in FIG. 3.

FIG. 3 is a plane view showing the light source element of the backlight device. FIG. 4 is a sectional view taken along a line A2-A2 in FIG. 3.

In the light source element 3, a plurality of light emitting diodes 9 are provided at predetermined intervals on the surface of a board 8 having a strip shape and an insulating property and having a predetermined wiring pattern on the back surface side thereof. In addition, a plurality of lenses 10 having a substantially semi-cylindrical shape like a cylinder divided in half along its long-axis direction are provided so as to cover the respective light emitting diodes 9. It is noted that the light emitting diode 9 is coated with a resin for sealing, such as epoxy resin or silicon rubber, which is not shown, so that the light emitting diode 9 is not exposed to air.

The lens 10 spreads light from the light emitting diode 9 (LED) as a light source, and irradiates a radiation subject with the light. The lens 10 is made of a transparent material having a refractive index of about 1.4 to 2.0, for example. Examples of the transparent material for the lens 10 include a resin such as epoxy resin, silicon resin, acrylic resin, or polycarbonate resin, glass, and a rubber such as silicon rubber. In particular, epoxy resin, silicon rubber, or the like which is used as a resin for sealing in the light emitting diode may be used.

In FIGS. 1 to 4, in the light source element 3, the plurality of light emitting diodes 9 and the plurality of lenses 10 for the respective light emitting diodes 9 are arranged in one row, as an example. However, the light emitting diodes 9 and the lenses 10 may be arranged in a plurality of rows such as two or three rows. In addition, when they are arranged in a plurality of rows, each component on adjacent rows may be arranged in a staggered fashion. In essence, they may be linearly arranged so as to face only the central zone of the liquid crystal display panel 1. In the present embodiment, the light source element 3 is placed so as to face the central zone of the liquid crystal display panel 1, so that the light source element 3 is placed so as to face substantially only the central zone of the backlight device 2. The following configurations shown in FIGS. 5 to 13 are applicable to both the case where the plurality of light emitting diodes 9 are arranged in one row and the case where they are arranged in a plurality of TOWS.

Next, the configuration of the lens 10 of the light source element 3 will be described in more detail.

Figure 6:
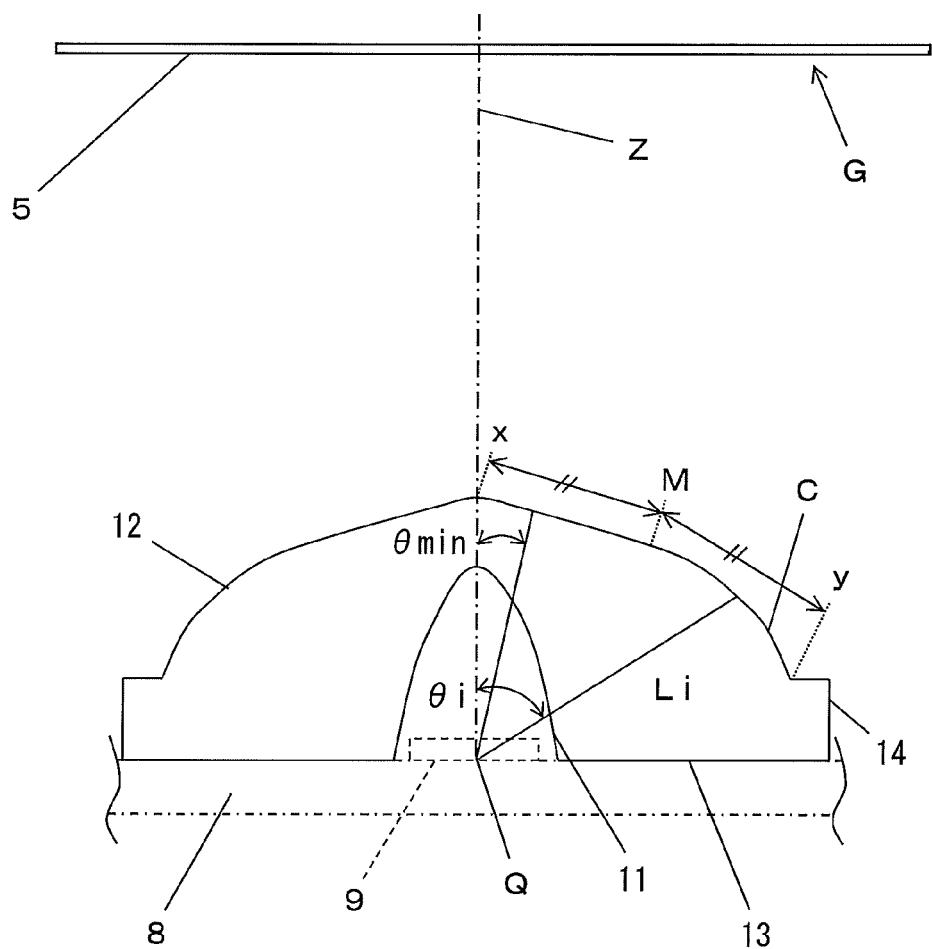
FIG. 6 is a sectional view of a lens as seen from a side surface in the arrangement direction of lenses.

FIG. 5 is a diagram illustrating the basic configuration of the light source element 3 in the backlight device according to the embodiment of the present disclosure. FIG. 6 is a sectional view of the lens as seen from a side surface in the arrangement direction of the lenses.

As shown in FIG. 5, the light emitting diode 9 as a light source and the lens 10 are placed such that the optical axes of them coincide with each other. The lens 10 spreads light from the light emitting diode 9 to irradiate a radiation subject surface G with the light. The illuminance distribution on the radiation subject surface G indicates the maximum on an optical axis Z which is the center line of the lens 10 in design, and the illuminance substantially monotonously decreases as departing from the center line.

The lens 10 includes an incident surface 11 which light from the light emitting diode 9 enters, and an exit surface 12 from which the incident light goes out. In addition, the lens 10 includes a bottom surface 13 present around the incident surface 11 and facing the direction opposite to the exit surface 12. In addition, an outer edge portion 14 protruding outward is provided between the exit surface 12 and the bottom surface 13. The edge of the exit surface 12 and the bottom surface 13 are connected via the outer surface of the outer edge portion 14. It is noted that the outer edge portion 14 may not be provided, and the edge of the exit surface 12 and the bottom surface 13 may be connected via a linear-shaped or arc-shaped end surface.

Light from the light emitting diode 9 enters the lens 10 via the incident surface 11 and goes out from the exit surface 12, to reach the radiation subject surface G. Thus, the light from the light emitting diode 9 spreads out owing to effects by the incident surface 11 and the exit surface 12, thereby reaching a wide range of the radiation subject surface G.

As shown in FIG. 6, the incident surface 11 of the lens 10 may be a continuous concave surface, and the projected shape thereof as seen from the upper surface may be an ellipse centered on the optical axis Z. The bottom surface 13 around the incident surface 11 may be a flat surface. However, a worked surface having a pyramidal shape or a mortar shape, or the like may be formed on the bottom surface 13.

The projected shape of the exit surface 12 of the lens 10 as seen from the upper surface and the front surface is a quadrangular shape such as a rectangle, and the projected shape as seen from the side surface in the arrangement direction of the lenses 10 (as seen laterally) is substantially an arc shape having a continuous convex surface portion. The curvature of the exit surface 12 at the center portion as seen from the side surface is, for example, substantially zero. Here, the "center portion" refers to an area within a predetermined radius from the optical axis Z, for example, an area within 1/10 of the radius of the outermost circumference (effective diameter) of the exit surface 12 as seen from the optical axis direction. The expression "substantially zero" means that the difference between the maximum sag amount and the minimum sag amount at the center portion is equal to or smaller than 0.1 mm, where the sag amount (sagY) is the distance between a reference point Q on the optical axis Z and any point on the exit surface 12 as measured in the optical axis direction. A lens of such a shape is easy to form and has a wide tolerance of variation.

As shown in FIG. 6, the exit surface 12 of the lens 10 may be formed such that a curvature C in a minute interval of the exit surface 12 on the sectional surface that includes the optical axis takes the maximum at an outer position with respect to a middle M of a convex surface interval x-y. In FIG. 6, $\theta_i$ indicates the position of the minute interval. Specifically, $\theta_i$ is the angle between the optical axis Z and a line Li connecting the center of the minute interval and the light source position on the optical axis Z, that is, $\theta_i$ is defined by $\theta_i \approx (\theta i(n+1)+\theta_i(n))/2$.

That is, in the present disclosure, the exit surface 12 of the lens 10 is formed such that, on the sectional surface that includes the optical axis as seen from the side surface in the arrangement direction, the curvature C in the minute interval of the exit surface 12 takes the maximum in a range defined by $60°<\theta_i<80°$. More preferably, the curvature C in the minute interval of the exit surface 12 takes the maximum in a range defined by $65°<\theta_i<75°$.

If the curvature C in the minute interval of the exit surface 12 exceeds the upper limit of the range defined by $60°<\theta_i<80°$, the variation tolerance for securing a light distribution property becomes small, and luminance unevenness on a surface of the plane light source increases. If the curvature C becomes smaller than the lower limit, a light distribution property becomes narrow, and luminance unevenness on a surface of the plane light source increases.

Here, the curvature C in the minute interval will be described with reference to FIG. 6 and parts (a) and (b) of FIG. 7. When the light source position on the optical axis is set as a reference, the curvature C in the minute interval is defined as follows. It is noted that the "light source position on the optical axis" is the intersection of the optical axis and the light emitting surface of the light source.

Figure 7:
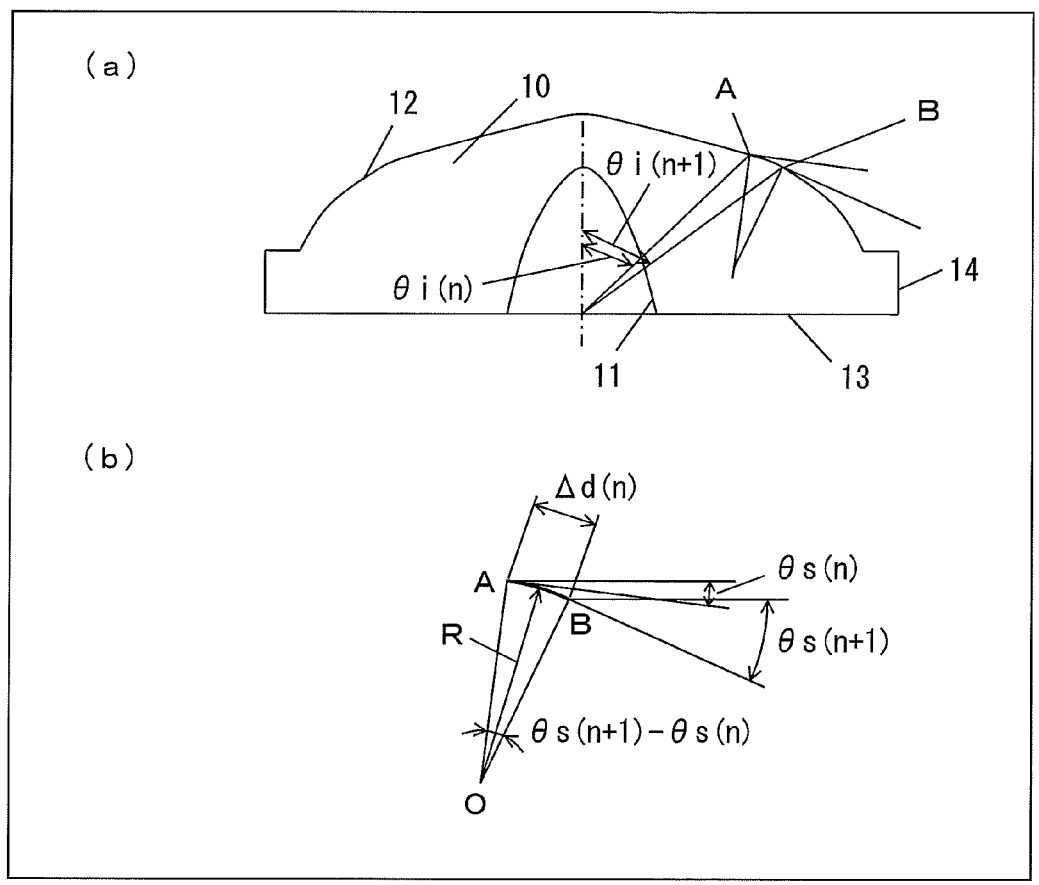
FIG. 7 is a diagram illustrating the light path of the lens.

As shown in parts (a) and (b) of FIG. 7, the n-th minute interval from the optical axis is assumed between a point A and a point B on the exit surface 12. $\theta_i(n)$ is the angle between the optical axis and a line connecting the point A and the light source position on the optical axis, and $\theta_i(n+1)$ is the angle between the optical axis and a line connecting the point B and the light source position on the optical axis. It is noted that $\theta_i(n+1)-\theta_i(n)$ is about 0.1°. $\theta_s(n)$ is the angle between the tangent line of the exit surface 12 at the point A and a plane perpendicular to the optical axis, and $\theta_s(n+1)$ is the angle between the tangent line of the exit surface 12 at the point B and a plane perpendicular to the optical axis. $\Delta d(n)$ is the length of a portion, of the exit surface 12, between the point A and the point B. If the interval between the point A and the point B is assumed to be sufficiently small and therefore the exit surface 12 between the point A and the point B is assumed to have a single curvature radius R, the center O of R is the intersection between the normal line of the exit surface 12 at the point A and the normal line of the exit surface 12 at the point B. Therefore, the angle AOB between the two normal lines is represented as $\theta_s(n+1)-\theta_s(n)$. The radius R of an arc between the point A and the point B, with the center of O, is represented as $\Delta d(n)/(\theta_s(n+1)-\theta_s(n))$. The curvature C is 1/R. Therefore, the curvature C in the n-th minute interval is $(\theta_s(n+1)-\theta_s(n))/\Delta d(n)$. It is noted that $\theta_s(n)$ and $\theta_s(n+1)$ are calculated by a unit of radian. In addition, in the above definition, the sign of the curvature C is positive when the curvature center O is present on the light source side from the exit surface 12, and negative when the curvature center O is present on the opposite side.

By using the above configuration, it becomes possible to realize the lens 10 that allows light that has come in through the incident surface 11 to go out toward a wide range from the exit surface 12.

In addition, in the exit surface 12 of the lens 10 of the present disclosure, where θ is the angle between the optical axis Z and a line connecting any point on the exit surface 12 and the reference point Q on the optical axis Z; sagY is the distance between the reference point Q on the optical axis Z and any point on the exit surface 12 as measured in the optical axis direction; and $sagY_0$ is the value of sagY as it is when θ is 0°, sagY monotonously decreases from $sagY_0$ as the maximum value. In the exit surface 12, where $\theta_{min}$ is the value of θ as it is when the curvature C in the minute interval of the exit surface 12 is the minimum, $\theta_{min}$ satisfies, for example, the range of $10°<\theta_i<30°$, except for the neighborhood of the optical axis Z. Here, the "neighborhood of the optical axis Z" is a region within a predetermined angle (for example, 8=2°) from the optical axis Z.

If the shape of the exit surface 12 is defined as described above, a Fresnel reflection component which varies along with variation in the size of the light emitting diode 9 is decreased. If $\theta_{min}$ at which the curvature C in the minute interval of the exit surface 12 takes the minimum is smaller than the lower limit of the range of $10°<\theta_{min}<30°$, the Fresnel reflection component is likely to occur, and if $\theta_{min}$ is larger than the upper limit, the size of the lens 10, for example, the length in the optical axis direction excessively increases.

Figure 8:
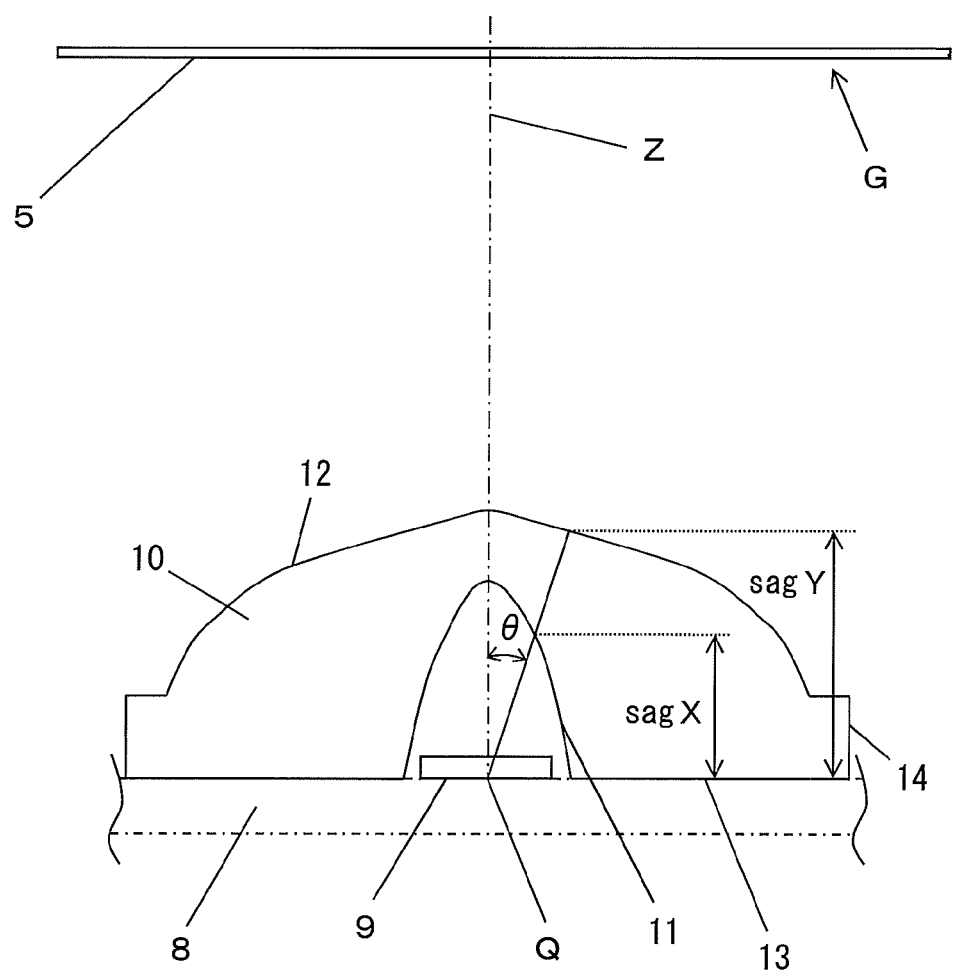
FIG. 8 is a sectional view showing a specific example of implementation of the lens.
Figure 9:
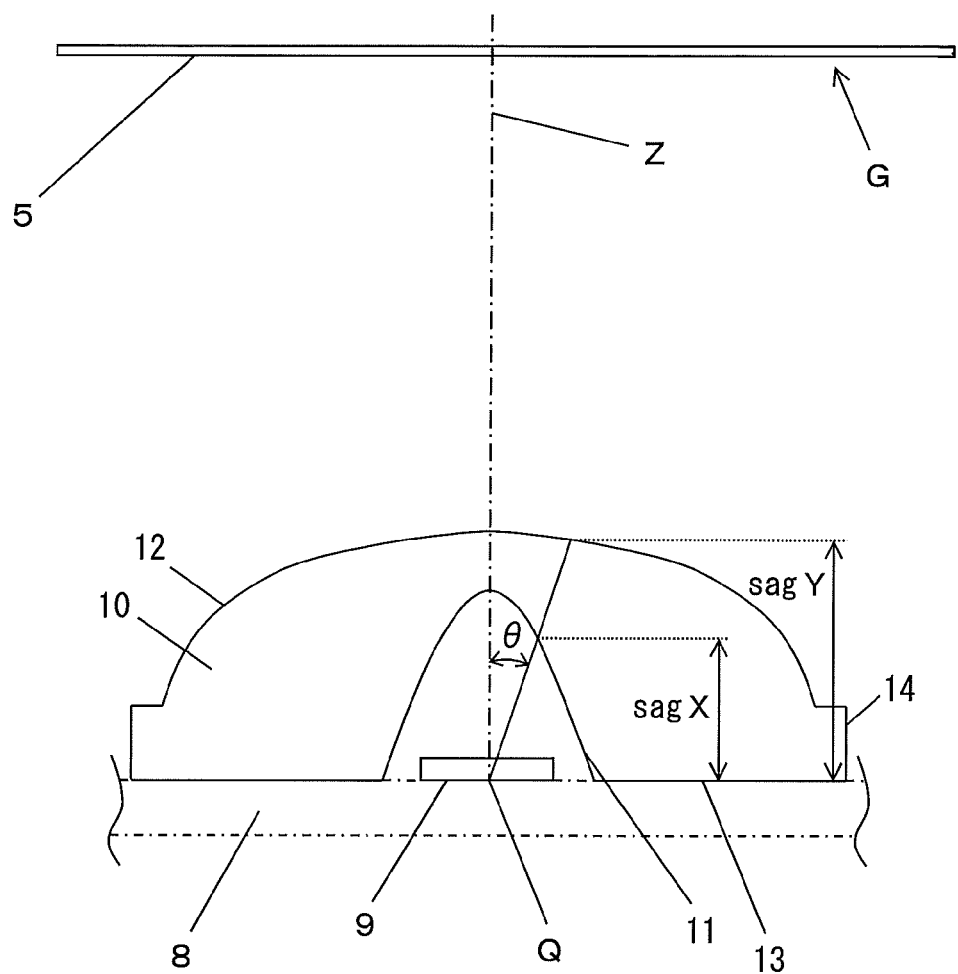
FIG. 9 is a sectional view showing another specific example of implementation of the lens.

FIGS. 8 to 11 show a specific example of implementation of the lens 10. It is noted that the purpose of the example is to expand the directionality, using a general-purpose light emitting diode as a light source. The size of the light emitting surface of the light emitting diode may be, for example, 3.0 mm×3.0 mm, 1.0 mm×1.0 mm, or 3.0 mm×1.0 mm.

θ in FIGS. 8 and 9 is the angle between the optical axis Z and a line connecting the reference point Q on the optical axis Z and any points on the incident surface 11 and the exit surface 12. In addition, sagX in the drawings is the distance between the reference point Q on the optical axis Z and any point on the incident surface 11 as measured in the optical direction. In addition, sagY is the distance between the reference point Q on the optical axis Z and any point on the incident surface 12 as measured in the optical direction.

Figure 10:
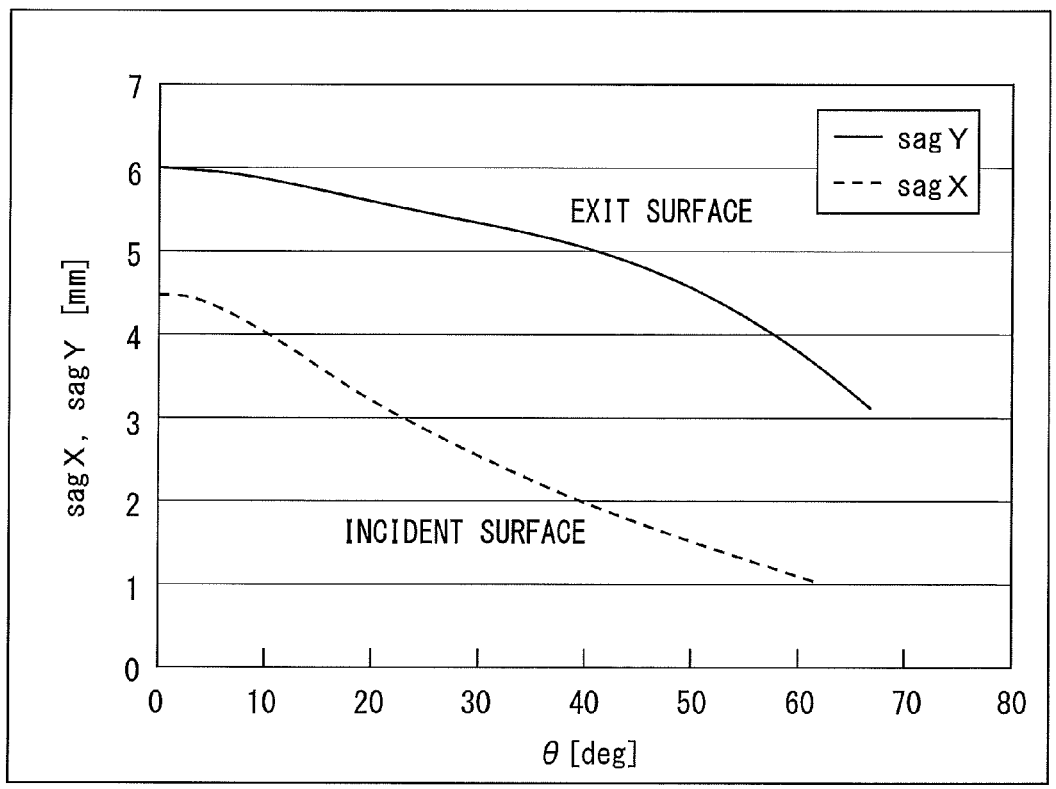
FIG. 10 shows the relationship among θ, sagX, and sagY in the lens shown in FIG. 8.

FIG. 10 is a graph of θ, sagX, and sagY in the example of the lens 10 shown in FIG. 8. The graph shows that sagY monotonously decreases from $sagY_0$ as the maximum.

FIG. 11 is a graph of θ, sagX, and sagY in the example of the lens 10 shown in FIG. 9. The graph shows that sagY monotonously decreases from $sagY_0$ as the maximum.

In the above embodiment, the light source element 3 includes the plurality of arranged lenses 10 having a substantially semi-cylindrical shape. However, an elongated lens 10 having a length corresponding to the length of the long side of the liquid crystal display panel 1 may be used. Also in this case, a plurality of light emitting diodes 9 are arranged, and a plurality of incident surfaces 11 corresponding to the respective light emitting diodes 9 are formed. In the case where a plurality of light emitting diodes 9 are arranged in a plurality of rows, a plurality of elongated lenses 10 corresponding to the number of rows of the light emitting diodes 9 may be provided in rows. Alternatively, one elongated lens having a plurality of incident surfaces 11 corresponding to the respective light emitting diodes 9 may be provided as in the case where a plurality of light emitting diodes 9 are arranged in one row.

It is noted that in the case where a plurality of lenses 10 are arranged, a working process for fabricating the lenses 10 by molding is easy to conduct with low cost, in comparison with the case where an elongated lens 10 is used. If the liquid crystal display panel 1 has a different screen size, the present disclosure can support the size in the long-side direction of the liquid crystal display panel 1 merely by adjusting the number of arranged lenses 10, and the like. Thus, it becomes possible to provide a liquid crystal display apparatus with low cost.

Next, the arrangement of the light sources of the light source element 3 will be described.

As shown in FIGS. 3 and 4, in the light source element 3 of the above embodiment, the length L in the arrangement direction of the lenses 10 having the configuration shown in FIG. 5, and the interval 1 between adjacent lenses 10 have a relationship of L<1, and the intervals 1 between the lenses 10 have substantially uniform lengths. By using such a configuration, it becomes possible to secure sufficient brightness as a backlight device and form the light source element 3 with a decreased number of lenses 10, thus providing the apparatus with low cost.

As shown in FIGS. 1 and 2, in the case where the components of the light source element 3 are linearly arranged in one row so as to face the central zone of the liquid crystal display panel 1, the inventors have confirmed in experiments that the amount of light emitted from the diffuser plate 5 is small at the end portions of the backlight device and it is difficult to secure sufficient brightness. In this case, the light emitting diode 9 having an increased output may be used, but the cost increases. On the other hand, a liquid crystal display apparatus is required to have increased brightness at the center of the screen in comparison with the side areas.

Figure 12:
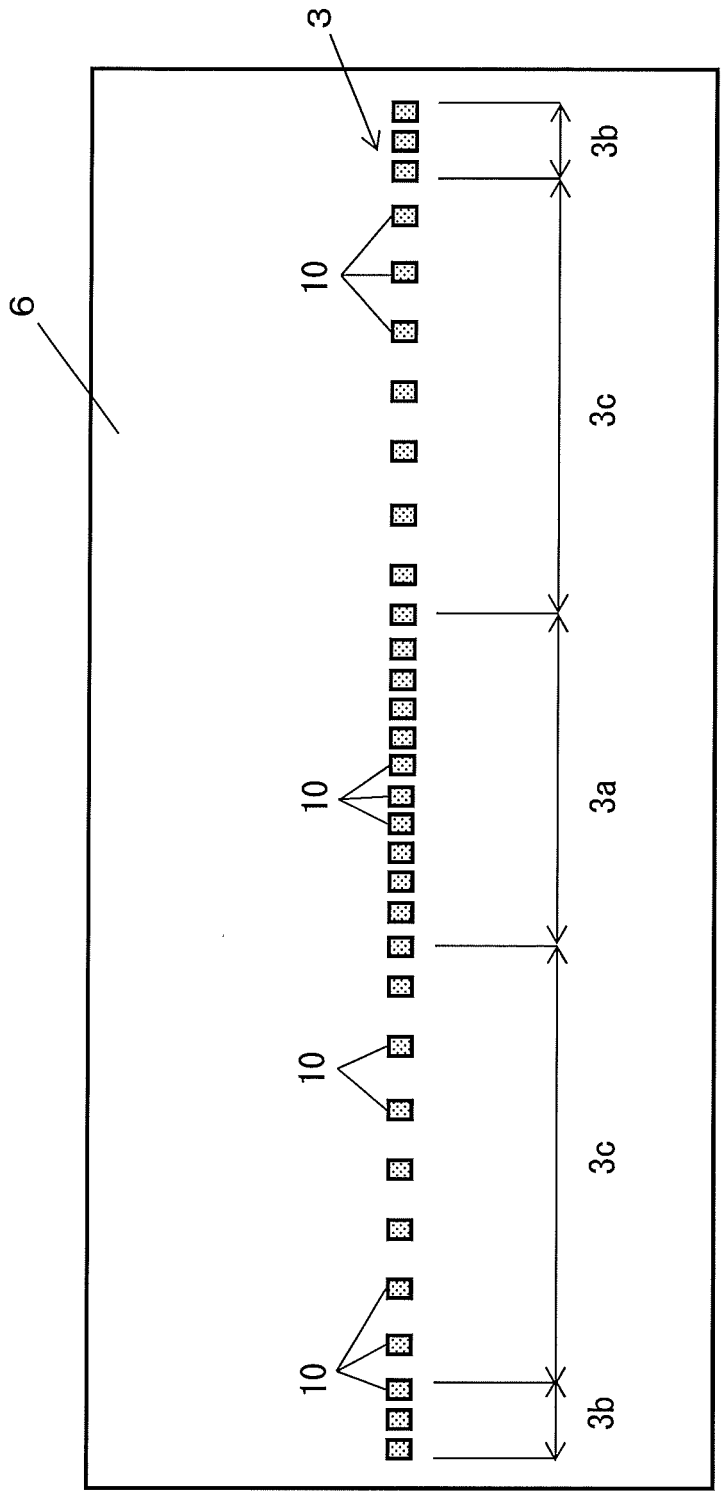
FIG. 12 is a plan view showing an example of arrangement of the lenses.

In the present disclosure, as shown in FIG. 12, by changing the intervals of arrangement of the individual light sources of the light source element 3, it is possible to provide a plane light source that emits light with uniform brightness as a whole, and to satisfy the requirements about the brightness of the screen of the liquid crystal display apparatus.

That is, as shown in FIG. 12, in the light source element 3 of the present disclosure, the arrangement intervals of the individual lenses 10 at a center 3a and edge regions 3b are narrow and dense, and meanwhile, the arrangement intervals of the individual lenses 10 at intervening regions 3c between the center 3a and the edge regions 3b are wide in comparison with those at the center 3a and the edge regions 3b. In addition, the intervals of the lenses 10 gradually vary around the boundaries between the center 3a and the intervening regions 3c and around the boundaries between the intervening regions 3c and the edge regions 3b.

In addition, in the light source element 3 of the present disclosure, a plurality of lenses 10 are linearly arranged so as to face the central zone of the liquid crystal display panel 1, and thus, if the liquid crystal display panel 1 has a different screen size, it is possible to support the size in the long-side direction of the liquid crystal display panel 1 merely by adjusting the number of arranged lenses 10, and the like. Meanwhile, according to a result of confirmation by the inventors through experiments, it has been found that the brightness of the entire screen including the short-side direction of the liquid crystal display panel 1 can be sufficiently satisfied by making the external shape of the lens 10 and the arrangement interval of the lenses 10 satisfy predetermined conditions.

That is, in the light source element 3 of the present disclosure, the brightness of the entire screen can be sufficiently secured if $d3<(2×d1)$ is satisfied where d1 is the length of the short side of the lens 10 which is perpendicular to the arrangement direction of the lenses 10, and d3 is the minimum value of the arrangement interval 1 of the lenses 10. In addition, more preferably, besides the above condition, $d2<(2×d1)$ is satisfied where d2 is the length of the long side of the lens 10 which is the side in the arrangement direction. In addition, more preferably, a condition of $d0<(d1/3)$ is combined where d0 is the thickness of the lens 10 with respect to the direction of the optical axis Z.

Next, the configuration of the diffuser plate 5 of the backlight device 2 will be described in more detail.

The diffuser plate 5 of the backlight device 2 radiates, in a diffused manner, from its front surface, light that has been radiated to the radiation subject surface G which is the back surface on the light source element 3 side, of the diffuser plate 5. That is, light is radiated to the radiation subject surface G of the diffuser plate 5 from the individual light sources of the light source element 3, i.e., the lenses 10, the illuminance of the light being uniformed in a wide range of the radiation subject surface G. Then, the radiated light is diffused by the diffuser plate 5, thus realizing a plane light source with a decreased unevenness of luminance on its surface. In addition, light from the light source element 3 is diffused by the diffuser plate 5 and then can return to the light source element 3 side or transmit through the diffuser plate 5. Light that has returned to the light source element 3 and comes into the reflection sheet 6 is reflected by the reflection sheet 6 and enters the diffuser plate 5 again.

Such a diffuser plate 5 is made of a plate-like member of acrylic resin, for example. Specifically, the diffuser plate 5 is formed of a translucent resin plate having a convex-concave shape on the surface thereof, on which minute particles are provided in a dispersed manner, in order to disperse light that has come in through one of the surfaces and goes out from the other surface.

Figure 13:
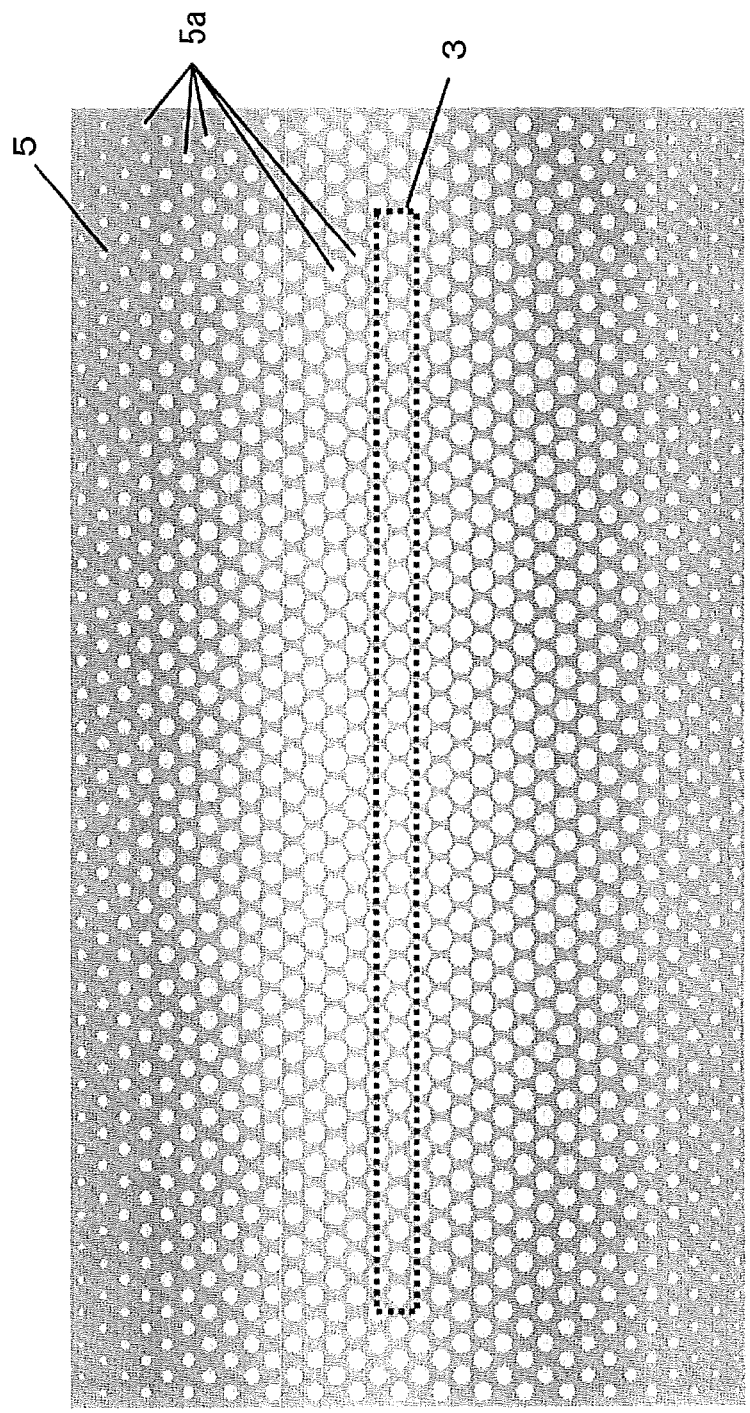
FIG. 13 is a plan view showing an example of a diffuser plate.

In addition, as shown in FIG. 13, the diffuser plate 5 has a transmittance distribution layer 5a on the radiation subject surface G which is the back surface on the light source element 3 side, of the diffuser plate 5, such that the transmittance decreases toward the central zone which corresponds to the light source element 3 and increases as separated from the central zone. The transmittance distribution layer 5a is formed of a reflecting member made of white ink that includes a white pigment, and the like. The area occupancy of the reflection pattern of the reflecting member increases toward the central zone and decreases as separated from the central zone. The white ink is ink obtained by dispersing, in a transparent binder, minute powder made of a transparent material with a high refractive index such as titanium oxide. The transmittance distribution layer 5a in a predetermined pattern is formed by means of screen printing.

Owing to the above configuration, it becomes possible to suppress light going out from the central zone, thereby realizing the above-described appropriate luminance distribution, with a relatively thin structure of about 50 mm.

Figure 14:
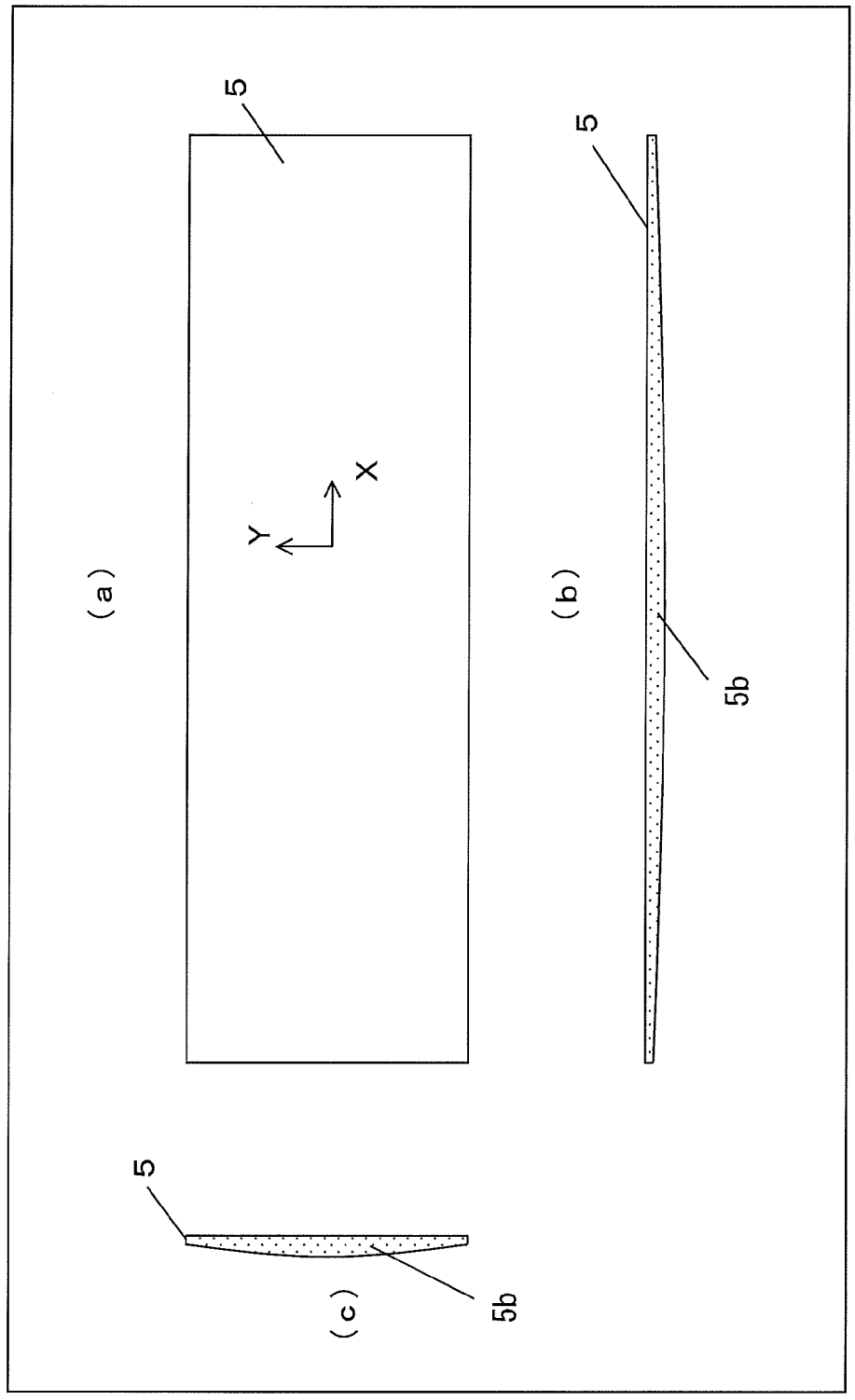
FIG. 14 is a plan view (a) showing an example of a diffuser plate, a sectional view (b) along the x-direction, and a sectional view (c) along the y-direction.

In addition, the diffuser plate 5 may have a cylindrical lens portion 5b formed on the radiation subject surface G which is the back surface on the light source element 3 side, of the diffuser plate 5 as shown in parts (a), (b), and (c) of FIG. 14.

That is, where X indicates the horizontal direction and Y indicates the vertical direction of the diffuser plate 5, the diffuser plate 5 is formed so as to have a curvature of an anamorphic curved surface or the like in the X-direction and the Y-direction and to decrease the thicknesses of the four corners of the diffuser plate 5, thus forming the cylindrical lens portion 5b on the radiation subject surface G which is the back surface on the light source element 3 side, of the diffuser plate 5.

As a specific example of implementation of the present disclosure, the diffuser plate 5 having the cylindrical lens portion 5b using an anamorphic curved surface, according to the present disclosure, and the diffuser plate 5 for comparison which does not have such a curved surface, have been prepared and placed as shown in FIGS. 1 and 2. Then, the luminances of both diffuser plates 5 have been measured and the luminance distributions with respect to the center value have been measured. As a result, it has been found that the values of the four corners of the diffuser 5 according to the present disclosure increases by about 5% from those of the diffuser plate 5 for comparison.

Thus, if the cylindrical lens portion 5b having a predetermined light distribution property is formed on the radiation subject surface G which is the back surface on the light source element 3 side, of the diffuser plate 5, a backlight device having a predetermined luminance distribution can be realized. Although the shape of the curved surface of the above diffuser plate 5 is an anamorphic curved surface, other arbitrary curved surfaces may be used. The diffuser plate 5 may be formed by sticking together a planar member and a cylindrical lens of a curved-surface shape as described above.

Next, the configuration of the reflection sheet 6 of the backlight device 2 will be described in more detail.

As shown in FIGS. 1 and 2, the reflection sheet 6 has substantially a cylinder-surface shape which is curved from the light source element 3 as the center toward the end portions of the backlight device 2 on the long sides, and has the opening portions 6a at positions corresponding to the respective lenses 10 of the light source element 3.

In the present disclosure, the angle between the optical axis Z of the lens 10 of the light source element 3, and a line connecting the central zone of the reflection sheet 6, that is, the light emitting surface of the light emitting diode 9 of the light source element 3, and the end portion of the curved surface of the reflection sheet 6, that is, the end portion of the backlight device 2 on the long side, is within a range of $60° \leq \theta_m \leq 80°$.

That is, by review based on a result of experiments by the inventors, the following fact has been found. In the backlight device in which the light source element 3 has a plurality of the lenses 10 linearly arranged so as to face the central zone of the liquid crystal display panel 1 as shown in FIGS. 1 and 2, if the angle between the optical axis Z of the lens 10 of the light source element 3, and a line connecting the central zone of the reflection sheet 6 and the end portion of the curved surface of the reflection sheet 6 is configured to be within a range of $60° \leq \theta_m \leq 80°$, luminance unevenness decreases and a plane light source having sufficient brightness can be realized.

It the above embodiment, the reflection sheet 6 has a shape curved from the light source element 3 as the center toward the end portions of the backlight device 2 on the long sides. However, instead of the curved shape, a linear shape may be used.

As described above, according to the present disclosure, in a backlight device using a light emitting diode, a light source element has a plurality of lenses linearly arranged so as to face the central zone of a liquid crystal display panel, whereby a backlight device and a liquid crystal display apparatus, with a simple configuration and low cost, securing sufficient brightness, can be provided.

As described above, the present disclosure is useful for obtaining a backlight device and a liquid crystal display apparatus with a simple configuration and low cost, securing sufficient brightness.

What is claimed is:

1. A backlight device comprising:
a light source element that comprises a plurality of light emitting diodes and a lens that spreads out light from the light emitting diodes;
a housing configured to contain the light source element;
a diffuser plate provided so as to cover an opening in the housing; and
a reflection sheet configured to reflect light emitted from the light source element, toward the diffuser plate; wherein
the plurality of light emitting diodes of the light source element are arrayed in one row or in a plurality of rows, at a central zone;
the lens has an incident surface that light from the light emitting diodes enters, and an exit surface from which the light goes out having been spread;
the exit surface of the lens is configured such that, in an optical-axis-containing sectional plane viewed laterally along the orientation in which the light emitting diodes are arrayed, the len's curvature C in a minute interval along the exit surface takes the maximum in a range defined by $60° < \theta_i < 80°$, where $\theta_i$ is the angle between the optical axis and a line connecting the center of the minute interval and a position of the light source element on the optical axis;
in the exit surface of the lens, where $\theta$ is the angle between the optical axis and a line connecting any point on the exit surface and the position of the light source on the optical axis, sagY is the distance between the position of the light source on the optical axis and any point on the exit surface as measured along the optical axis, and $sagY_0$ is the value of sagY as it is when $\theta$ is 0°, sagY monotonously decreasing from $sagY_0$ as the maximum value; and
in the exit surface, where $\theta_{min}$ is the value of $\theta$ as it is when the curvature C in the minute interval of the exit surface is the minimum, $\theta_{min}$ satisfies a range of $10° < \theta_{min} < 30°$, except for a region within a predetermined angle from the optical axis.

2. The backlight device according to claim 1, wherein the projected shape of the exit surface as viewed from the upper surface and the front surface is a quadrangular shape, and the projected shape as viewed laterally in the arraying orientation of the lenses is substantially an arc shape.

3. A backlight device comprising:
a light source element that comprises a plurality of light emitting diodes and a lens that spreads out light from the light emitting diodes;
a housing configured to contain the light source element;
a diffuser plate provided so as to cover an opening in the housing; and
a reflection sheet configured to reflect light emitted from the light source element, toward the diffuser plate; wherein
the plurality of light emitting diodes of the light source element are arrayed in one row or in a plurality of rows, at a central zone;
the lens has an incident surface that light from the light emitting diodes enters, and an exit surface from which the light goes out having been spread;
the exit surface of the lens is configured such that, in an optical-axis-containing sectional plane viewed laterally along the orientation in which the light emitting diodes are arrayed, the len's curvature C in a minute interval along the exit surface takes the maximum in a range defined by $60° < \theta_i < 80°$, where $\theta_i$ is the angle between the optical axis, and a line connecting the center of the minute interval and a position of the light source element on the optical axis; and
in the exit surface of the lens, a curvature in a region within a predetermined radius from the optical axis as viewed laterally is such that, where a sag amount is the distance between the position of the light source on the optical axis and any point on the exit surface as measured along the optical axis, the difference between a maximum sag amount and a minimum sag amount in the region within the predetermined radius is equal to or smaller than 0.1 mm.

4. The backlight device according to claim 3, wherein the projected shape of the exit surface as viewed from the upper surface and the front surface is a quadrangular shape, and the projected shape as viewed laterally in the arraying orientation of the lenses is substantially an arc shape.

5. A liquid crystal display apparatus comprising:
a liquid crystal display panel; and
a backlight device placed on the back surface side of the liquid crystal display panel and having a size corresponding to the liquid crystal display panel, wherein the backlight device includes:
a light source element that comprises a plurality of light emitting diodes and a lens that spreads out light from the light emitting diodes;
a housing configured to contain the light source element;
a diffuser plate provided so as to cover an opening in the housing; and
a reflection sheet configured to reflect light emitted from the light source element, toward the diffuser plate; wherein
the plurality of light emitting diodes of the light source element are arrayed in one row or in a plurality of rows, at a central zone,
the lens has an incident surface that light from the light emitting diodes enters, and an exit surface from which the light goes out having been spread,
the exit surface of the lens is configured such that, in an optical-axis-containing sectional plane viewed laterally along the orientation in which the light emitting diodes are arrayed, the len's curvature C in a minute interval along the exit surface takes the maximum in a range defined b $60° < \theta_i < 80°$, where $\theta_i$ is the angle between the optical axis, and a line connecting the center of the minute interval and a position of the light source element on the optical axis,
in the exit surface of the lens, where $\theta$ is the angle between the optical axis and a line connecting any point on the exit surface and the position of the light source on the optical axis, sagY is the distance between the position of the light source on the optical axis and any point on the exit surface as measured along the optical axis, and $sagY_0$ is the value of sagY as it is when $\theta$ is 0°, sagY monotonously decreases from $sagY_0$ as the maximum value, and
in the exit surface, where $\theta_{min}$ is the value of $\theta$ as it is when the curvature C in the minute interval of the exit surface is the minimum, $\theta_{min}$ satisfies a range of $10° < \theta_{min} < 30°$, except for a region within a predetermined angle from the optical axis.

6. The liquid crystal display apparatus according to claim 5, wherein the projected shape of the exit surface as viewed from the upper surface and the front surface is a quadrangular shape, and the projected shape as viewed laterally in the arraying orientation of the lenses is substantially an arc shape.

7. A liquid crystal display apparatus comprising:
a liquid crystal display panel; and
a backlight device placed on the back surface side of the liquid crystal display panel and having a size corresponding to the liquid crystal display panel, wherein the backlight device includes:
a light source element that comprises a plurality of light emitting diodes and a lens that spreads out light from the light emitting diodes;
a housing configured to contain the light source element;
a diffuser plate provided so as to cover an opening in the housing; and
a reflection sheet configured to reflect light emitted from the light source element, toward the diffuser plate; wherein
the plurality of light emitting diodes of the light source element are arrayed in one row or in a plurality of rows, at a central zone,
the lens has an incident surface that light from the light emitting diodes enters, and an exit surface from which the light goes out having been spread,
the exit surface of the lens is configured such that, in an optical-axis-containing sectional plane viewed laterally along the orientation in which the light emitting diodes are arrayed, the len's curvature C in a minute interval along the exit surface takes the maximum in a range defined by $60° < \theta_i < 80°$, where $\theta$ is the angle between the optical axis, and a line connecting the center of the minute interval and a position of the light source element on the optical axis, and
in the exit surface of the lens, a curvature in a region within a predetermined radius from the optical axis as viewed laterally is such that, where a sag amount is the distance between the position of the light source on the optical axis and any point on the exit surface as measured along the optical axis, the difference between a maximum sag amount and a minimum sag amount in the region within the predetermined radius is equal to or smaller than 0.1 mm.

8. The liquid crystal display apparatus according to claim 7, wherein the projected shape of the exit surface as viewed from the upper surface and the front surface is a quadrangular shape, and the projected shape as viewed laterally in the arraying orientation of the lenses is substantially an arc shape.

9. A lens that is used in a backlight device having a light source element that comprises a plurality of light emitting diodes and a lens that spreads light from the light emitting diodes, wherein:

the plurality of light emitting diodes of the light source element are arrayed in one row or in a plurality of rows, at a central zone;

the lens has an incident surface that light from the light emitting diodes enters, and an exit surface from which the light goes out having been spread;

the exit surface of the lens is configured such that, in an optical-axis-containing sectional plane viewed laterally along the orientation in which the light emitting diodes are arrayed, the len's curvature C in a minute interval along the exit surface takes the maximum in a range defined by $60°<\theta_i<80°$, where $\theta_i$ is the angle between the optical axis, and a line connecting the center of the minute interval and a position of the light source element on the optical axis;

in the exit surface of the lens, where $\theta$ is the angle between the optical axis and a line connecting any point on the exit surface and the position of the light source on the optical axis, sagY is the distance between the position of the light source on the optical axis and any point on the exit surface as measured along the optical axis, and sagY$_0$ is the value of sagY as it is when $\theta$ is 0°, sagY monotonously decreasing from sagY$_0$ as the maximum value; and in the exit surface, where $\theta_{min}$ is the value of $\theta$ as it is when the curvature C in the minute interval of the exit surface is the minimum, $\theta_{min}$ satisfies a range of $10°<\theta_{min}<30°$, except for a region within a predetermined angle from the optical axis.

10. The lens according to claim 9, wherein the projected shape of the exit surface as viewed from the upper surface and the front surface is a quadrangular shape, and the projected shape as viewed laterally in the arraying orientation of the lenses is substantially an arc shape.

11. A lens that is used in a backlight device having a light source element that comprises a plurality of light emitting diodes and a lens that spreads light from the light emitting diodes, wherein:

the plurality of light emitting diodes of the light source element are arrayed in one row or in a plurality of rows, at a central zone;

the lens has an incident surface that light from the light emitting diodes enters, and an exit surface from which the light goes out having been spread;

the exit surface of the lens is configured such that, in an optical-axis-containing sectional plane viewed laterally along the orientation in which the light emitting diodes are arrayed, the len's curvature C in a minute interval along the exit surface takes the maximum in a range defined by $60°<\theta_i<80°$, where $\theta_i$ is the angle between the optical axis, and a line connecting the center of the minute interval and a position of the light source element on the optical axis; and in the exit surface of the lens, a curvature in a region within a predetermined radius from the optical axis as viewed laterally is such that, where a sag amount is the distance between the position of the light source on the optical axis and any point on the exit surface as measured along the optical axis, the difference between a maximum sag amount and a minimum sag amount in the region within the predetermined radius is equal to or smaller than 0.1 mm.

12. The lens according to claim 11, wherein the projected shape of the exit surface as viewed from the upper surface and the front surface is a quadrangular shape, and the projected shape as viewed laterally in the arraying orientation of the lenses is substantially an arc shape.

* * * * *